United States Patent
Shiraishi

[19]

[11] Patent Number: 6,002,926
[45] Date of Patent: Dec. 14, 1999

[54] DOUBLE SUPERHETERODYNE TYPE RECEIVING CIRCUIT

[75] Inventor: Osamu Shiraishi, Tokyo, Japan

[73] Assignee: NEC Corporation, Japan

[21] Appl. No.: 08/936,650

[22] Filed: Sep. 24, 1997

[30] Foreign Application Priority Data

Sep. 27, 1989 [JP] Japan .................................. 8-256237

[51] Int. Cl.[6] .................................................. H04B 1/26
[52] U.S. Cl. ........................ 455/314; 455/311; 455/315; 455/259
[58] Field of Search .................................. 455/314, 315, 455/316, 295, 260, 311, 313, 259

[56] References Cited

U.S. PATENT DOCUMENTS

| | | | |
|---|---|---|---|
| 5,204,983 | 4/1993 | Jones | 455/315 |
| 5,230,095 | 7/1993 | Onodera et al. | 455/315 |
| 5,388,125 | 2/1995 | Toda et al. | 455/260 |
| 5,390,346 | 2/1995 | Marz | 455/316 |
| 5,497,509 | 3/1996 | Lautzenhiser | 455/260 |
| 5,499,393 | 3/1996 | Fukui | 455/260 |
| 5,603,099 | 2/1997 | Watanabe | 455/260 |
| 5,606,736 | 2/1997 | Hasler et al. | 455/260 |
| 5,710,997 | 1/1998 | Okanobu | 455/316 |
| 5,832,375 | 11/1996 | Leisten et al. | 455/314 |

OTHER PUBLICATIONS

NEC Corporation, Bipolar Digital Integrated Circuit μPB10001GR, Sep. 1993.

Dr. M. Hagiwara, et al., Utility PLL Frequency Synthesizer, Fig. 6.22.

SONY Corporation, Sony Semiconductor Home Page, New Technology, 1995–1997.

*Primary Examiner*—Dwayne D. Bost
*Assistant Examiner*—Quochien B. Vuong
*Attorney, Agent, or Firm*—Ostrolenk, Faber, Gerb & Soffen, LLP

[57] ABSTRACT

A double superheterodyne type receiving circuit having a first local oscillating circuit for converting a received signal into a first intermediate frequency signal and a second local oscillating circuit for converting the first intermediate frequency signal into a second intermediate frequency signal, comprising an oscillator 16 composing the first local oscillating circuit, a first variable frequency divider 17 composing the second oscillating circuit for dividing the frequency of an output signal of the first oscillator, a second variable frequency divider 18 for dividing the frequency of an output signal of the first variable frequency divider, a variable frequency dividing controlling circuit 23 for controlling frequency dividing values of the first and second variable frequency dividers on the base of an exponential function relation, at least one fixed frequency divider 19 for dividing the frequency of an output signal of the second variable frequency divider 18, a reference oscillator 20 for outputting a signal with a predetermined frequency, and a phase comparator 22 for comparing an output signal of the fixed frequency divider 19 and an output signal of the reference oscillator 20 and controlling an oscillation frequency of the oscillator.

9 Claims, 7 Drawing Sheets

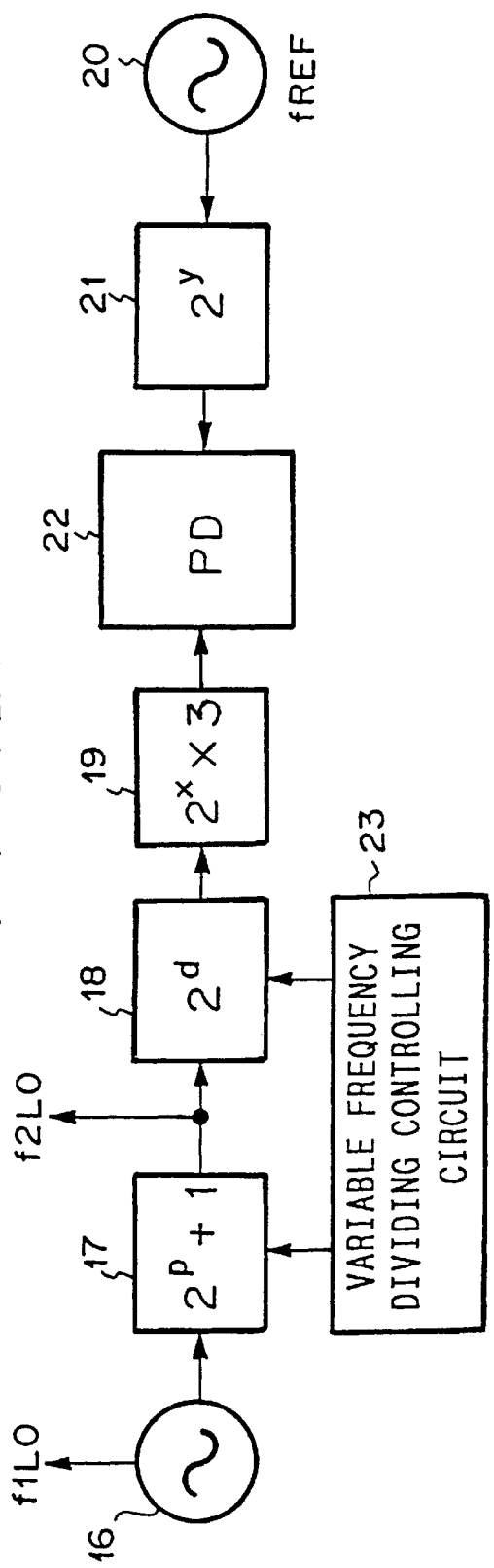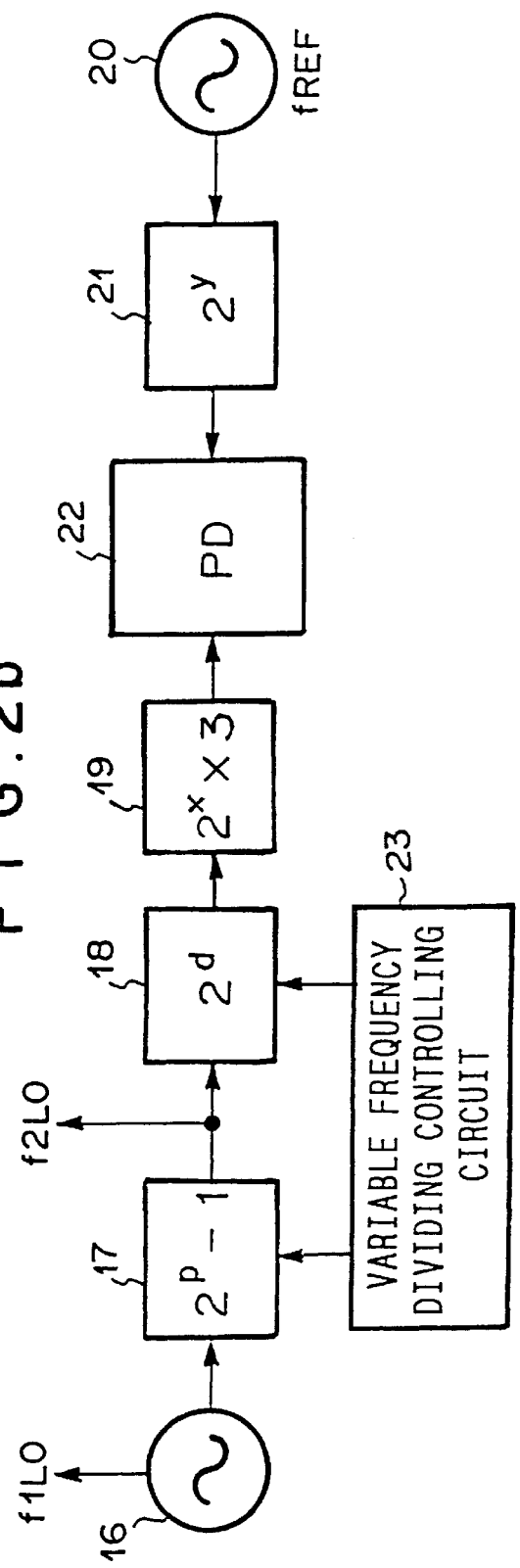

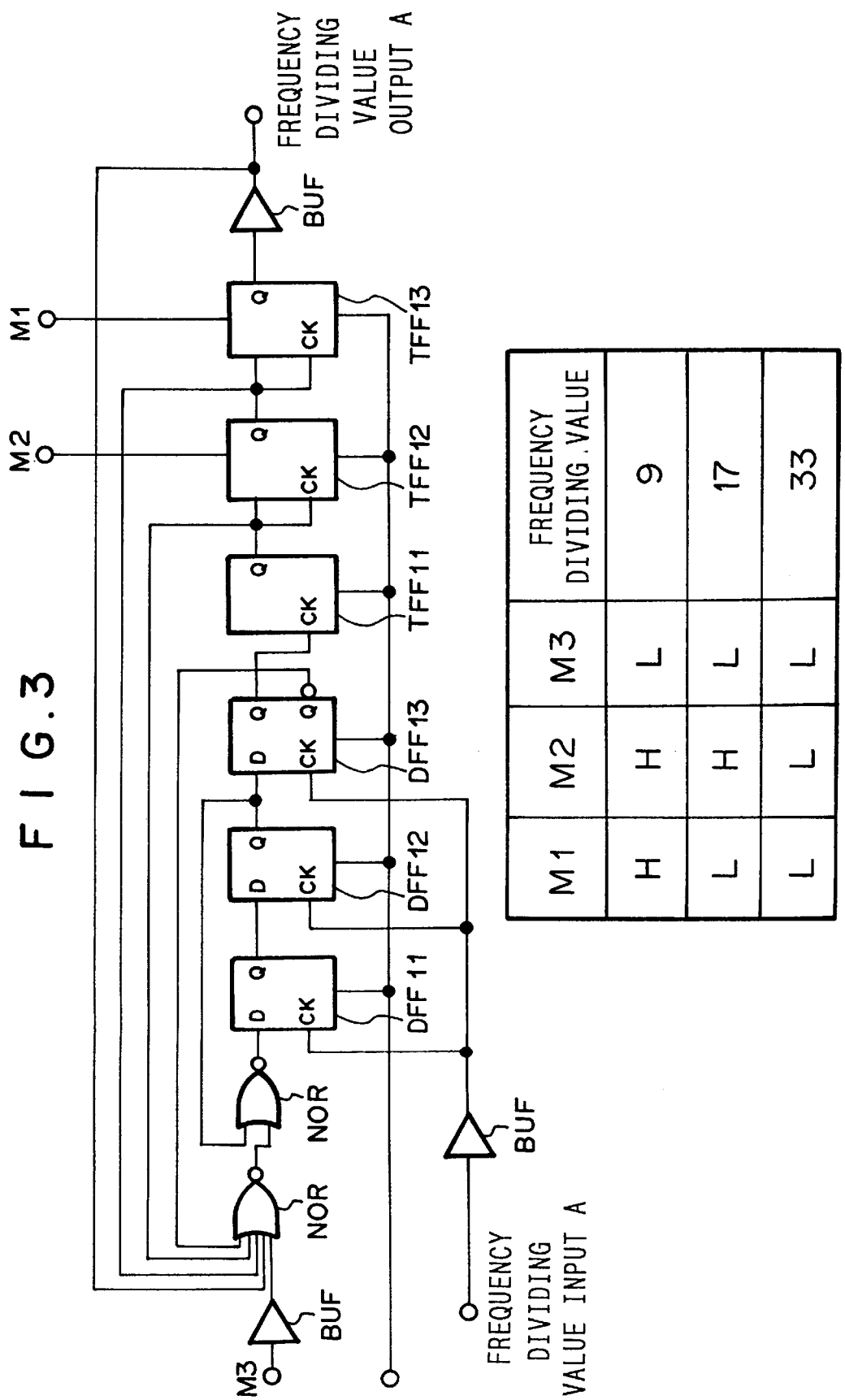
F I G. 3

DOUBLE SUPERHETERODYNE TYPE RECEIVING CIRCUIT

BACKGROUND OF THE INVENTION

1. Field of the Invention

The present invention relates to a double superheterodyne type radio frequency receiving circuit, in particular, to a PLL frequency synthesizer type receiving circuit.

2. Description of the Related Art

For example, in a radio frequency receiving circuit for use with a GPS (Global Positioning System), a double superheterodyne system that converts a received signal into a first intermediate frequency (IF) signal and a second intermediate frequency (IF) signal is most popularly used. On the other hand, the first IF frequency may accord with or be close to a frequency of a local FM broadcast in some regions. As mentioned later, a leakage of the first IF frequency of GPS receiver or an intrusion of an FM broadcast radio wave causes an intermodulation, resulting in degrading the accuracy of the received signal. In particular, since a GPS receiver has a high gain amplifier for the second intermediate frequency, the problem may need to change the frequency to another frequency. Thus, a conventional GPS receiver is operated with a fixed different frequency that depends on the region where the receiver is used. Consequently, it is difficult to accomplish a GPS receiver using identical IF frequency in the world wide.

FIG. 6 shows an example of the structure of such a GPS receiver as described in "Paper Machine μPB1001GR" issued by NEC. An RF received signal (frequency: fRF) is supplied to an RF amplifier 11. The RF amplifier 11 amplifies the RF received signal. A first mixer 12 mixes the amplified RF received signal with an oscillation frequency f1LO of a voltage controlling oscillator (VCO) 16 that composes a first local oscillator (LO) and outputs a first IF signal (frequency: f1IF). The first IF signal is amplified by a first IF amplifier 13. A second mixer 14 mixes the amplified first IF signal with a frequency f2LO of a second LO and outputs a second IF signal (frequency: f2IF). The second IF signal is amplified by a second IF amplifier 15. The second IF signal is output to a demodulator or the like (not shown). The second LO is composed of a plurality of fixed frequency dividers (in this example, six frequency dividers) 24 to 29. By selecting one of output signals of the fixed frequency dividers, the frequency f2LO of the relevant second LO is obtained. An output signal of the fixed frequency divider 29 on the last stage is supplied to a phase comparator 22. The phase comparator 22 compares the output signal of the fixed frequency divider with an oscillation frequency fREF of a reference oscillator 20. With a compared result of an output signal of the reference oscillator 20 and the output signal of the fixed frequency divider 29, the oscillation frequency of the VCO 16 is controlled. In such a structure, a PLL synthesizer is accomplished.

In this structure, when the oscillation frequency of the VCO 16 is varied, the frequency f1LO of the first LO can be varied. Thus, the frequency f1IF of the first IF signal can be varied. However, to vary the oscillation frequency of the VCO 16, the oscillation frequency fRF of the reference oscillator 20 should be also varied. In addition, as the frequency f1IF of the first IF signal is varied, the frequency f2IF of the second IF signal is also varied. Thus, when one of the output signals of the fixed frequency dividers 24 to 28 is selected as an output signal of the second LO, the frequency f2IF of the second IF signal can not be fixed.

As another example of the structure of which a variable frequency divider is composed of a pulse swallow type counter is known. FIG. 7 shows such a structure. In this structure, instead of the fixed frequency dividers 24 to 29 shown in FIG. 6, two variable frequency dividers 30 and 31 are used. A VCO 16 outputs a signal with an oscillation frequency of a first LO. In addition, the oscillation frequency of the VCO 16 is divided by the first variable frequency divider 30. The reference oscillator 20 outputs a signal with an oscillation frequency of a second LO. In addition, the oscillation frequency of the reference oscillator 20 is divided by the second variable frequency divider 31. These frequencies of the output signals of the first and second variable frequency dividers 30 and 31 are compared by a phase comparator 22. Thus, the VCO is controlled. The frequency dividing values of the first and second variable frequency dividers 30 and 31 are controlled by a variable frequency controlling circuit 32. A variable frequency controlling circuit 32 can set a continuous integral dividing value to dividers 30 and 31 and can not set without the continuous integral dividing value.

By varying the oscillation frequency of the VCO 16, the frequency f1IF of the first IF signal can be varied. By controlling the frequency dividing value of the variable frequency divider 30 corresponding to the variation of the frequency of the first IF signal, the frequency f2IF of the second IF can be fixed. However, since the frequency of the second LO is fixed, as the frequency of the first IF signal is varied, the frequency fRF of the received signal is also varied. Thus, a signal with a desired frequency can not be received.

In the structure shown in FIG. 6, to vary the oscillation frequency of the VCO that is the first LO, the oscillation frequency of the reference oscillator should be varied at the same time. In addition, since the frequency f2IF of the second IF signal is fixed regardless of the variation of the frequency of the first IF signal, one of output signals of a plurality of fixed frequency dividers should be selected. However, actually, when an output signal of a small number of fixed frequency dividers is selected, the second IF frequency cannot be fixed to a predetermined constant frequency. Thus, the structure shown in FIG. 6 has a practical problem.

On the other hand, in the structure shown in FIG. 7, since the frequency f2LO of the second LO is fixed, if the frequency f1IF of the first IF signal is compulsorily varied, the frequency fRF of the received signal is varied. Thus, such a structure cannot be applied to a GPS receiver or the like. In this case, to vary the frequency of the first IF signal without varying the frequency of the received signal, as with the structure shown in FIG. 6, the reference oscillator side should be structured so that it can vary the frequency as a PLL synthesizer. As a result, two PLL synthesizers are required. Thus, the structure becomes complicated. In addition, the frequency dividing value of the variable frequency divider should be controlled corresponding to the variation of the oscillation frequency of the reference oscillator. Consequently, an institution of the dividing value is complicated and troublesome.

Further, a radio frequency receiver represented by GPS leaks the first IF signal of the radio receiver and causes intermodulations with induced FM broadband radio at near FM broadband stations and nearly frequency band area. Therefore, each other of the radio frequency receiver and other equipments may give an impediment to a receive precision. In particular, since the GPS receiver is composed by a high gain second IF amplifier for the second IF, the problem is remarkable. Therefore, the GPS receiver is currently operated each of areas. However, the GPS receiver can not operate at a special area toward the namely world wide global positioning system. Thus, the GPS receiver should be changed and needed the system composing frequency each by area for taking off the broadband frequency band. Further, a current RF frequency receiver has a problem that a first IF frequency can not independently be varied without unvaried RF frequency and second IF frequency interfacial of the GPS system.

SUMMARY OF THE INVENTION

An object of the present invention is to provide a double superheterodyne type receiving circuit that allows the frequency of the first IF signal to be varied while the frequencies of output signals of the received signal, reference oscillator, and second IF signal are fixed, that is composed by one PLL frequency synthesizer and a simplicity structure, and that can be operated over a global region.

The present invention is a double superheterodyne type receiving circuit having a first local oscillating circuit for converting a received signal into a first intermediate frequency signal and a second local oscillating circuit for converting the first intermediate frequency signal into a second intermediate frequency signal, comprising an oscillator composing the first local oscillating circuit, a first variable frequency divider composing the second oscillating circuit for dividing the frequency of an output signal of the first oscillator, a second variable frequency divider for dividing the frequency of an output signal of the first variable frequency divider, a variable frequency dividing controlling circuit for controlling frequency dividing values of the first and second variable frequency dividers with a predetermined relation, at least one fixed frequency divider for dividing the frequency of an output signal of the second variable frequency divider, a reference oscillator for outputting a signal with a predetermined frequency, and a phase comparator for comparing an output signal of the fixed frequency divider and an output signal of the reference oscillator and controlling an oscillation frequency of the oscillator. Further, the variable frequency dividing controlling circuit controls the frequency dividing values on the base of an exponential function.

The frequency dividing values of the first and second variable frequency dividers are controlled to binary variable-digit frequency dividing values, the number of digits of each of the variable frequency dividing values having a relation, when the number of digits of one of the variable frequency dividing values is an odd number, the total frequency dividing values becoming variable.

These and other objects, features and advantages of the present invention will become more apparent in light of the following detailed description of a best mode embodiment thereof, as illustrated in the accompanying drawings.

BRIEF DESCRIPTION OF DRAWINGS

FIGS. 2a and 2b are block diagrams showing the relation of frequency dividing values in the case that local oscillators are upper local and lower local;

FIG. 3 is a circuit diagram showing an example of the structure of a first variable frequency divider in the case that local oscillators are upper local;

DESCRIPTION OF PREFERRED EMBODIMENT

Figure 1:
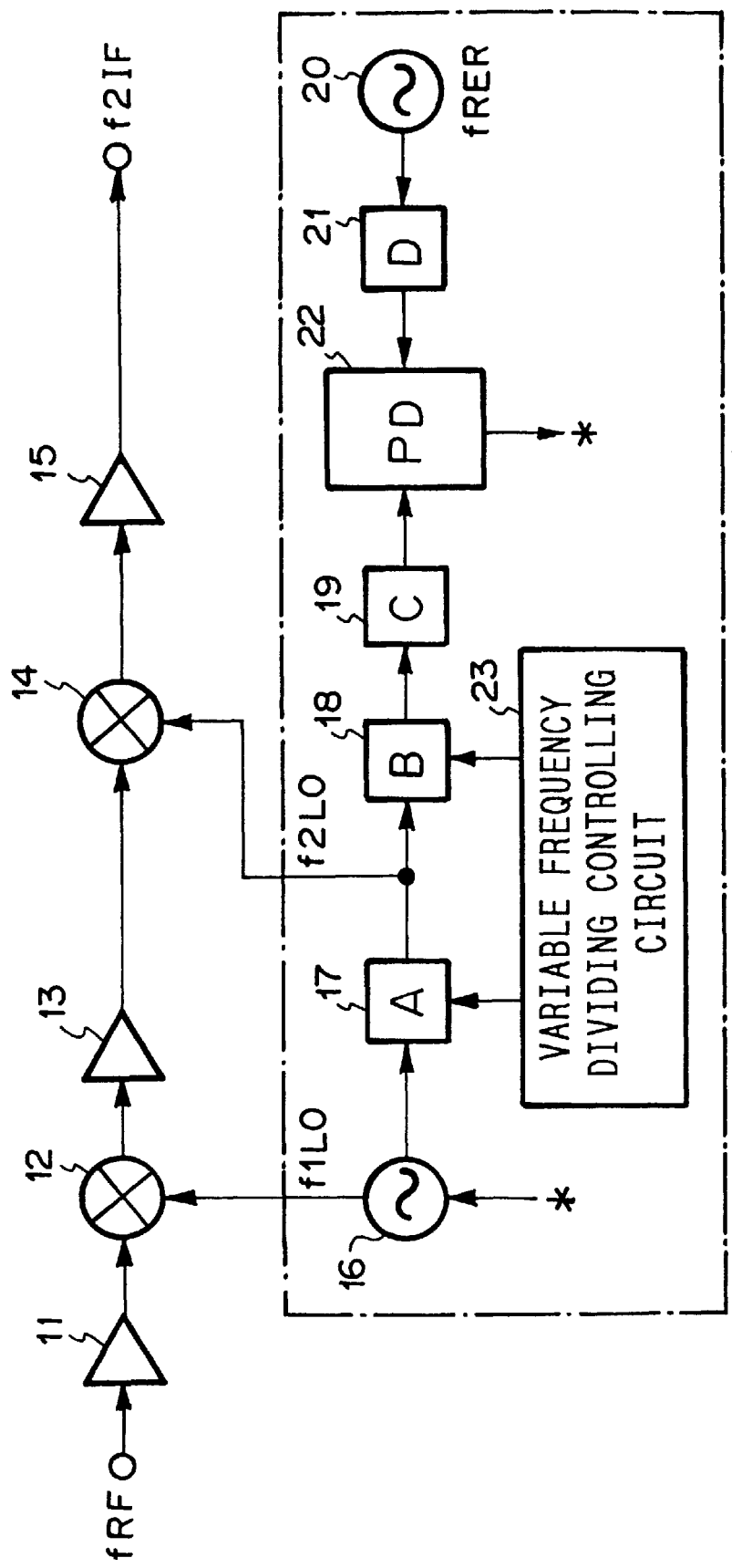
FIG. 1 is a block diagram showing a basic structure of the present invention.

An embodiment of the present invention will be described with reference to the accompanying drawings. FIG. 1 is a block diagram showing a basic structure of the present invention. In FIG. 1, a received RF signal 11 (frequency: fRF) is amplified by an RF amplifier 11. A first mixer 12 converts the RF signal into a first IF signal. A first IF amplifier 13 amplifies the first IF signal. The amplified first IF signal is supplied to a second mixer 14. The second mixer 14 converts the first IF signal into a second IF signal. A second IF amplifier 15 amplifies the second IF signal. The amplified second IF signal is output to a demodulator or the like (not shown). An oscillation output signal (frequency: f1LO) of a VCO 16 is input as a first LO to the first mixer 12. An output signal of the VCO 16 is supplied to a first variable frequency divider 17 (frequency dividing value: A). The first frequency divider 17 divides the frequency of the output signal of the VCO 16. An output signal of the first frequency divider 17 is supplied as a second LO to the second mixer 14. An output signal of the second LO is supplied to a second variable frequency divider 18 (frequency dividing value: B). The second variable frequency divider 18 divides the frequency of the output signal of the second LO. In addition, the output signal of the second LO is supplied to a first fixed frequency divider 19 (frequency dividing value: C). The first fixed frequency divider 19 divides the frequency of the output signal of the second LO. On the other hand, a reference oscillator 20 outputs an oscillation signal with a fixed frequency (fREF). The oscillation signal is supplied to a second fixed frequency divider 21 (frequency dividing value: D). The second fixed frequency divider 21 divides the frequency of the oscillation signal. Output signals of the first and second fixed frequency dividers 19 and 21 are compared by a phase comparator 22. With the compared result of the phase comparator 22, the VCO 16 is controlled. In addition, the frequency dividing values A and B of the first and second variable frequency dividers 17 and 18 are controlled by a variable frequency dividing controlling circuit 23.

According to the structure shown in FIG. 1, when the frequency dividing values A and B of the first and second variable frequency dividers 17 and 18 are controlled by the variable frequency dividing controlling circuit 23, the frequency f1LO of the first LO and the frequency f2LO of the second LO can be varied with a predetermined relation. With the predetermined relation, while the oscillation frequency fREF of the reference oscillator 20 is kept constant, the frequency f1IF of the first IF signal can be varied. On the other hand, with the frequency fRF of the received signal and the frequency f2IF of the second IF signal fixed, a signal with a predetermined frequency that is received can be output as a second IF signal with a predetermined frequency f2IF. Thus, with one PLL synthesizer for the VCO 16, the frequency of the first IF signal can be properly varied.

As modes of the present invention, the first LO and the second LO may be upper local and lower local, respectively. Since the relation between the frequency dividing values of the frequency dividers and the frequencies of the two LOs differs in these modes, they will be separately described. As an example of which the effect of the present invention is remarkably obtained, a frequency of a GPS receiver will be described. The frequency of an RF received signal of a commercial GPS is fRF=1575.42 MHz. In the GPS, the frequency dividing value is 1540. Thus, the frequency of the local oscillator is 1.023 MHz (f0=1.023 MHz). In other words, fRF=1540 (f0). Next, with f2IF=4(f0) and fREF=16 (f0) that are most commonly used in Japan and North America, the relation between the frequency dividing values of the frequency dividers and the two LOs will be described.

When two LOs are upper local, the following relation is satisfied in a double superheterodyne circuit.

$$f1IF=f1LO-fRF=(16\cdot A\cdot B\cdot C/D-1540)f0 \quad (1)$$

$$f1IF=f2LO-f2IF=(16\cdot B\cdot C/D-4)f0 \quad (2)$$

With Formulas (1) and (2), $16\cdot A\cdot B\cdot C/D-1540=16\cdot B\cdot C/D-4$ $16\cdot(A-1)\cdot B\cdot C/D=1536$ Thus, $A-1=96\cdot D/(B\cdot C)$ $$A-1=(2^5\times 3\times D)/(B\cdot C) \quad (3)$$

Assuming that $A=2^p+1$; $B=2^d$; $C=2^x\times 3$; $D=2^y$ (where p and d are variable parameters; x and y are any constants), $$2^p=(2^5\times 3\times 2^y)/(2^d\times 2^x\times 3)$$

$$2^{p+d}=2^{5-x+y}$$

Thus, $$p+d=5-x+y \quad (3)$$

With Formulas (1) and (2), $$f1IF=(16\cdot B\cdot C/D-4)f0=(16\times 2^d\times 2^x\times 3/2^y-4)f0$$

With Formula (3), $$f1IF=(2^{9-p}\times 3-4)f0 \quad (4)$$

since $f1IF>4f0$; $9-p\geq 0$; $2^p+1>3$, thus, $1\leq p\leq 5$; where p is an integer.

Therefore, since the parameter A is $2^p+1$, the variable frequency dividing controlling circuit 23 controls the first and second variable frequency dividers 17 and 18 on the base of an exponential function.

FIG. 2a shows a structure of which the calculated results are applied to the individual frequency dividers of the structure shown in FIG. 1.

When the two LOs are lower local, the following formulas are satisfied in a double superheterodyne receiving circuit.

$$f1IF=fRF-f1LO=(1540-16\cdot A\cdot B\cdot C/D)f0 \quad (5)$$

$$f1IF=f2LO+f2IF=(16\cdot B\cdot C/D+4)f0 \quad (6)$$

With Formulas (5) and (6), as same with the case of the upper local, $$A+1=(2^5\times 3\times D)/(B\cdot C) \quad (7)$$

Assuming that $A=2^p-1$; $B=2^d$; $C=2^x\times 3$; $D=2^y$ (where p and d are variable parameters; x and y are any constants).

$$2^p=(2^5\times 3\times 2^y)/(2^d\times 2^x\times 3)$$

$$2^{p+d}=2^{5-x+y}$$

Thus, $$p+d=5-x+y$$

These conditions are the same as those in Formula (3). With Formulas (5) and (6), $$f1IF=(16\cdot B\cdot C/D+4)f0=\{[2^d\times 2^x\times 3/2^y]\times 16+4\}f0$$

With Formula (3), $$f1IF=(2^{9-p}\times 3+4)f0 \quad (8)$$

where since $f1IF>4f0$; $9-p\geq 0$ and $2^p-1>3$, thus, $2\leq p\leq 5$; where p is an integer.

Therefore, since the parameter A is $2^p-1$, the variable frequency dividing controlling circuit 23 controls the first and second variable frequency dividers 17 and 18 on the base of an exponential function.

FIG. 2b shows a structure of which the calculated results are applied to the structure shown in FIG. 1.

In the above description, the frequency dividing values A, B, C, and D and frequencies fRF, f2IF, and fREF are only examples. It should be noted that the relations expressed by Formulas (3), (4), and (8) are satisfied when another frequency is upper local or lower local or when one of two LOs is upper local and the other is lower local.

With Formulas (4) and (8), in f1IF, p that is an exponent of the frequency dividing value A of the first variable frequency divider 17 is a parameter. Thus, regardless of whether local oscillators are upper local or lower local, when the frequency dividing values A and B of the first and second variable frequency dividers 17 and 18 are designated so that formulas with respect to p and d obtained from the relation of the frequencies of the double superheterodyne system are satisfied, even if fRF, f2IF, and fREF are constant, it is clear that f1IF can be independently varied.

In the case that local oscillators are upper local, assuming that x−y=0, the following relation of the frequency dividing values A and B can be obtained with Formula (3) as follows.

(A, B)=(33, 1), (17, 2), (9, 4), (3, 16)

Thus, as expressed by A=2p+1 and B=2d, A and B are exponential functions.

In the case that local oscillators are lower local, assuming that x−y=0, the following relation of the frequency dividing values A and B can be obtained with Formula (3) as follows.

(A, B)=(31, 1), (15, 2), (7, 4), (3, 8)

Thus, since $A=2^p-1$ and $B=2^d$, parameters A and B are exponential functions. Therefore, parameter A is sequentially expressed in binary notation as follows.

$2^0+2^1+2^2+2^3+2^4$, $2^0+2^1+2^2+2^3$, $2^0+2^1+2^2$, $2^0+2^1$.

FIG. 3 is a circuit diagram showing the structure of the first variable frequency divider 17 composed of flip-flop circuits such as a very common modular's pre-scaler. With the first variable frequency divider 17, the structure shown in FIG. 2a is accomplished in the case that the two LOs are upper local. As shown in FIG. 3, the first variable frequency divider 17 comprises three D type flip-flops DFFs 11 to 13, three T-type flip-flops TFFs 11 to 13, NORs, and buffers. The D-type flipflops and T-type flip-flops are conventional flip-flops. Next, the operation of the first variable frequency divider 17 will be described. As the operation of the first variable frequency divider 17, the D-type flip-flops DFFs 11 to 13 and the T-type flip-flops TFFs 11 divide the frequency of the input signal by eight. When the signal level of M1 and M2 input signals of M terminals of T-type flip-flops TFFs 12 and 13 are L, the T-type flip-flops TFFs 12 and 13 divide the frequency of the input signal by two. Thus, the basic frequency dividing value 8 is multiplied by 2. When the signal level of an M3 input signal is H, the above-described frequency dividing values are maintained. When the signal level of the M3 input signal is L, each frequency dividing value of the block is added by 1. Thus, as shown in a logic table, values 33, 17, and 9 can be accomplished as variable frequency dividing values A.

Figure 4:
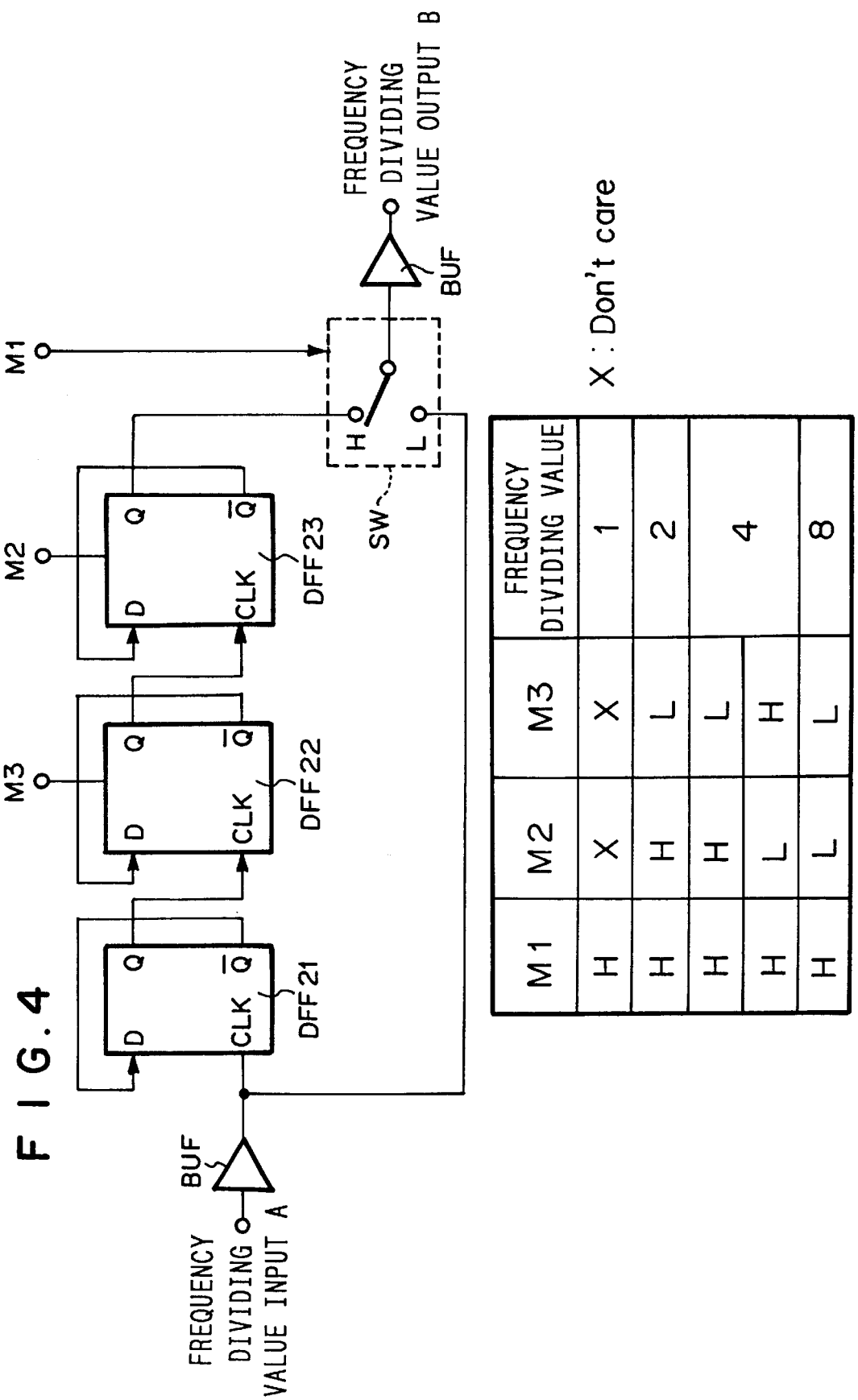
FIG. 4 is a circuit diagram showing an example of the structure of a second variable frequency divider in the case that local oscillators are upper local.

FIG. 4 shows the structure of the second variable frequency divider 18 that comprises one switch SW and three D-type flip-flops DFFs 21 to 23. In this structure, when the signal level of an M1 signal is L, the frequency dividing value is 1. When the signal level of the M1 signal is H, the D-type flip-flops DFFs 21 to 23 operate. The D-type flip-flops DFFs 21 divide the frequency of the input signal by 2. When the signal levels of M2 and M3 signals of the D-flip flops DFFs 22 and 23 become L, the basic frequency dividing value 2 is multiplied by 2. As shown in a logic table, values 1, 2, and 4 can be accomplished as variable frequency values B.

Figure 5:
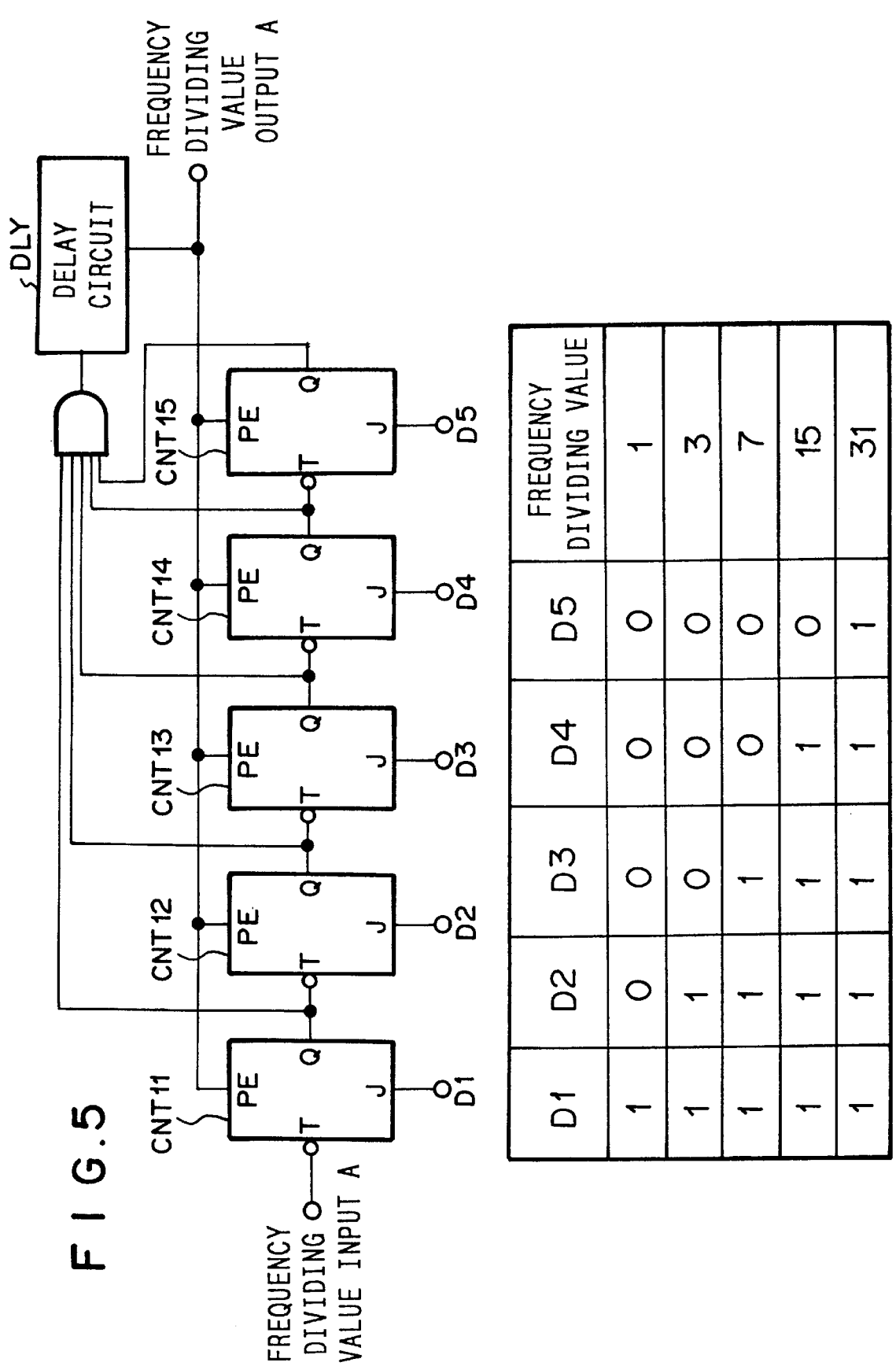
FIG. 5 is a circuit diagram showing an example of the structure of a first variable frequency divider in the case that local oscillators are lower local.
Figure 6:
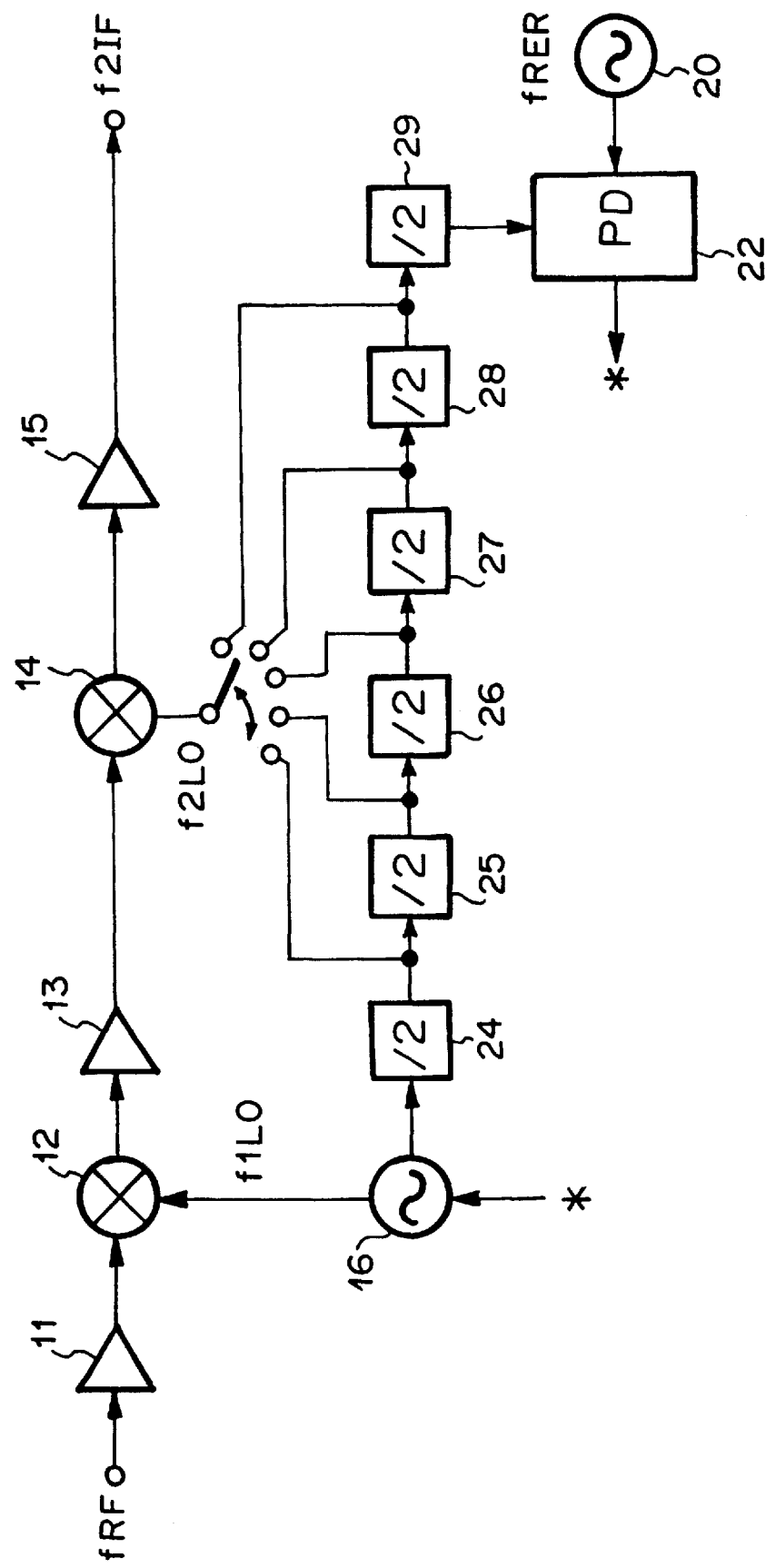
FIG. 6 is a block diagram showing an example of a conventional receiving circuit.
Figure 7:
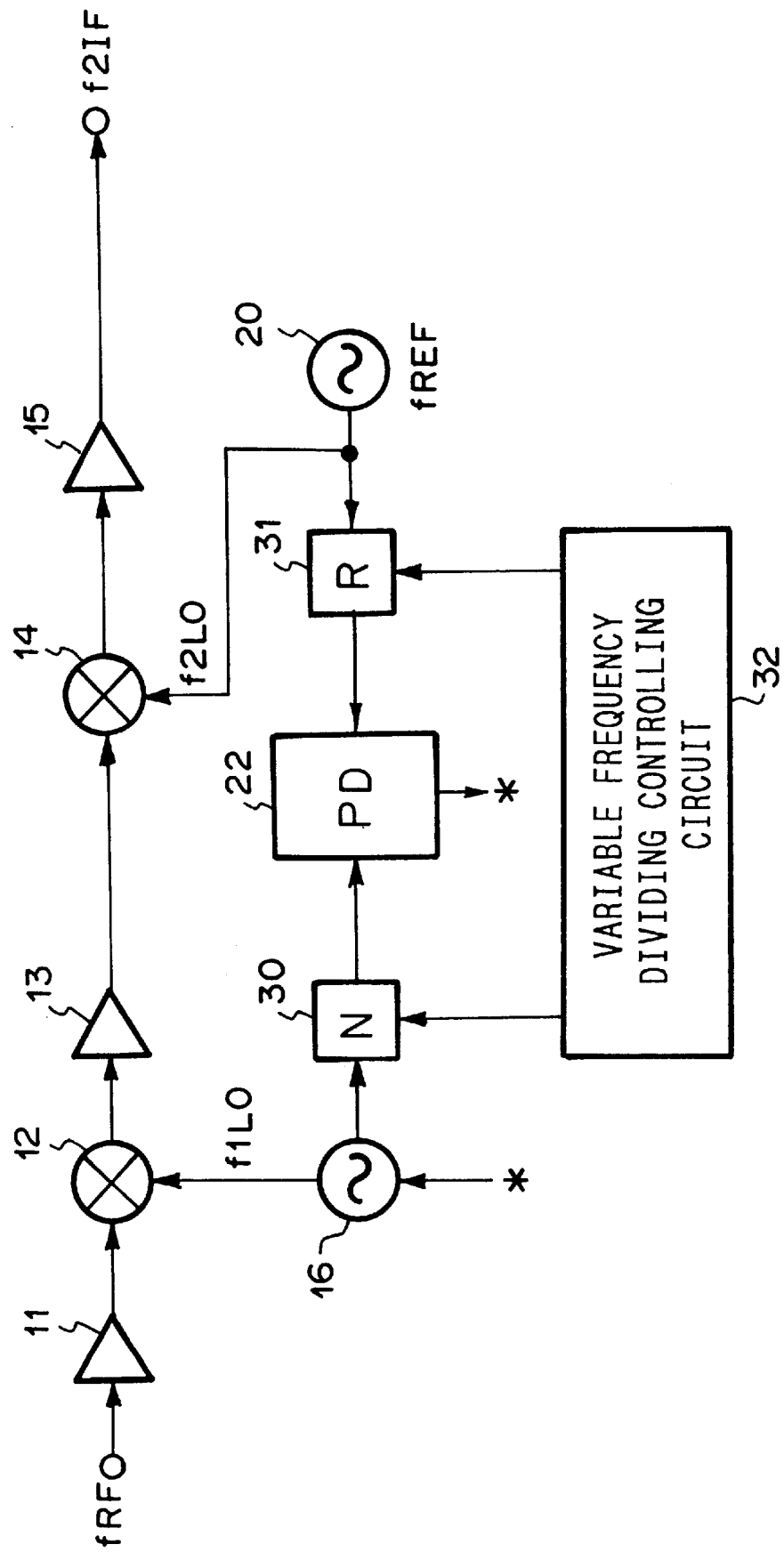
FIG. 7 is a block diagram showing another example of a conventional receiving circuit.

On the other hand, when the two LOs are lower local, the frequency dividing values B of the second variable frequency divider 18 can be accomplished by the above-described circuit. However, since the frequency dividing values A of the first variable frequency divider 17 are sequentially expressed in binary notation, the second variable frequency divider 18 can be accomplished by a counting circuit such as a programmable counter. FIG. 5 shows an example of the structure of which the first variable frequency diver comprises five-digit binary counters CNTs 11 to 15 and a delay circuit DLY. In this structure, the counter CNTs 11 to 15 are assigned digits 0 to 4 of binary digits. By setting individual bits D1 to D5 to "1", frequency dividing values can be obtained. When the bit D1 is set to "1", since $2^0=1$, the frequency dividing value is 1. When the bits D1 to D5 are set to "1", since $2+2^1+2^2+2^3+2^4=31$, the frequency dividing value is 31. As shown in a logic table in shown FIG. 5, values 1, 3, 7, 15, and 31 are obtained as frequency dividing values A.

As described above, according to the present invention, the frequency of an output signal of an oscillator as a first LO is divided by a first variable frequency divider. The resultant signal is output as an output signal of a second LO. The frequency of the output signal is divided by a second variable frequency divider. In addition, the frequency of the output signal is divided by a first fixed frequency divider. The frequency of an output signal of a reference oscillator is divided by a second fixed frequency divider. The phase of the output signal of the reference oscillator and the phase of the output signal of the second fixed frequency divider are compared. With the compared result, the oscillators are controlled. In addition, since the frequency dividing values of the first and second variable frequency dividers are controlled with a predetermined relation, while the received frequency, the frequency of the second IF signal, and the frequency of the reference oscillator are fixed, the frequency of the first IF signal can be varied on the base of an exponential function.

Thus, the frequency of the first IF signal can be prevented from being close to a frequency band of another unit. Thus, the degradation of the receive accuracy that is affected by the environment of radio wave can be prevented. Consequently, a receiving circuit whose operation is not restricted by regional conditions can be accomplished. In addition, according to the present invention, it is not necessary to vary the oscillation frequency of the reference frequency unlike with the related art reference. Thus, in the receiving circuit according to the present invention, the number of PLL synthesizers can be reduced to one. Consequently, the structure can be simplified. In addition, since the structure of the frequency divider is simplified, the size thereof can be reduced. Thus, the present invention can also contribute to reducing the size of a radio frequency unit.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A double superheterodyne type receiving circuit for receiving a radio frequency signal, comprising:
   a first local oscillating circuit controlled a first oscillating corresponding to an oscillation frequency of a reference oscillator;
   a second local oscillating circuit controlled a second oscillating frequency corresponding to an oscillation frequency of a reference oscillator;
   a first mixer for mixing the radio frequency signal and the first local oscillating frequency of said first local oscillating circuit and outputting a first intermediate frequency signal;
   a second mixer for mixing the first intermediate frequency signal and the second local oscillating frequency of said second local oscillating circuit and outputting a second intermediate frequency signal; and
   means for being able to vary a first intermediate frequency of the first intermediate frequency signal while the frequencies of the received radio frequency signal, the reference oscillator, and the second intermediate frequency are fixed.

2. The double superheterodyne type receiving circuit as set forth in claim 1,
   wherein said means for being able to vary the first intermediate frequency on the base of an exponential function.

3. The double superheterodyne type receiving circuit as set forth in claim 1,
   wherein a first oscillation output signal (frequency: f1LO) of said first local oscillating circuit is input as a first LO to said first mixer,
   an output signal of said first local oscillating circuit is supplied to a first variable frequency divider (frequency dividing value: A),
   a first variable frequency divider divides the frequency of the output signal of said first local oscillating circuit,
   an output signal of the first variable frequency divider is supplied as a second oscillating frequency signal of said second local oscillating circuit LO (frequency: f2LO) to said second mixer,
   an output signal of said second local oscillating circuit LO is supplied to a second variable frequency divider (frequency dividing value: B),
   the second variable frequency divider divides the frequency of the output signal of the second local oscillating circuit LO,
   the output signal of the second local oscillating circuit LO is supplied to a first fixed frequency divider (frequency dividing value: C), the first fixed frequency divider divides the frequency of the output signal of the second local oscillating circuit LO, the reference oscillator outputs an oscillation signal with a fixed frequency (fREF), the oscillation signal is supplied to a second fixed frequency divider (frequency dividing value: D), the second fixed frequency divider divides the frequency of the oscillation signal, output signals of the first and second fixed frequency dividers are compared by a phase comparator, and said first local oscillating circuit is controlled with the compared result of the phase comparator.

4. The double superheterodyne type receiving circuit as set forth in claim 3, wherein, further, the frequency dividing values A and B of the first and second variable frequency dividers are controlled by a variable frequency dividing controlling circuit.

5. The double superheterodyne type receiving circuit as set forth in claim 3, wherein, when the frequency of the received radio signal is fRF=1575.42 MHz, the frequency of the reference oscillator is 1.023 MHz (f0=1.023 MHz), fRF=1540 (f0), f2IF=4(f0) and fREF=16(f0),following formulas com into, $$f1IF=f1LO-fRF=(16 \cdot A \cdot B \cdot C/D-1540)f0$$

$$f1IF=f2LO-f2IF=(16 \cdot B \cdot C/D-4)f0.$$

6. A double superheterodyne type receiving circuit having a first local oscillating circuit for converting a received signal into a first intermediate frequency signal and a second local oscillating circuit for converting the first intermediate frequency signal into a second intermediate frequency signal, comprising:

a first oscillator composing the first local oscillating circuit;

a first variable frequency divider composing the second oscillating circuit for dividing the frequency of an output signal of said first oscillator;

a second variable frequency divider for dividing the frequency of an output signal of said first variable frequency divider;

a variable frequency dividing controlling circuit for controlling frequency dividing values of said first and second variable frequency dividers with a predetermined relation;

at least one fixed frequency divider for dividing the frequency of an output signal of said second variable frequency divider;

a reference oscillator for outputting a signal with a predetermined frequency; and a phase comparator for comparing an output signal of said fixed frequency divider and an output signal of said reference oscillator and controlling an oscillation frequency of said first oscillator.

7. The double superheterodyne type receiving circuit as set forth in claim 6, wherein the frequency dividing values of said first and second variable frequency dividers are controlled to binary variable-digit frequency dividing values, the number of digits of each of the variable frequency dividing values having a relation, when the number of digits of one of the variable frequency dividing values is an odd number, the total frequency dividing values becoming variable.

8. The double superheterodyne type receiving circuit as set forth in claim 6, wherein the frequency of the first intermediate frequency signal f1IF is expressed by as follows:

$$f1IF=(16 \cdot A \cdot B-1540)f0$$

where A is the frequency dividing value of said first variable frequency divider; B is the frequency dividing value of said first variable frequency divider; C is the frequency dividing value of the first intermediate frequency signal; f0 is $\frac{1}{1540}$ of the frequency of the received signal.

9. The double superheterodyne type receiving circuit as set forth in claim 7, wherein the frequency of the first intermediate frequency signal f1IF is expressed by as follows:

$$f1IF=(16 \cdot A \cdot B-1540)f0$$

where A is the frequency dividing value of said first variable frequency divider; B is the frequency dividing value of said first variable frequency divider; C is the frequency dividing value of the first intermediate frequency signal; f0 is $\frac{1}{1540}$ of the frequency of the received signal.

* * * * *

UNITED STATES PATENT AND TRADEMARK OFFICE
CERTIFICATE OF CORRECTION

PATENT NO. : 6,002,926
DATED : Dec. 14, 1999
INVENTOR(S) : SHIRAISHI

It is certified that error appears in the above-identified patent and that said Letters Patent is hereby corrected as shown below:

On the title page:

Item [30] Foreign Application Priority Data, "Sep. 27, 1989" should read -- Sep. 27, 1996 --.

Signed and Sealed this

Nineteenth Day of September, 2000

Attest:

Q. TODD DICKINSON

*Attesting Officer*  *Director of Patents and Trademarks*